(12) United States Patent
Dagli et al.

(10) Patent No.: US 7,733,135 B2
(45) Date of Patent: Jun. 8, 2010

(54) HIGH SIDE BOOSTED GATE DRIVE CIRCUIT

(75) Inventors: Paras M. Dagli, Plano, TX (US); David John Baldwin, Allen, TX (US); Adam Shook, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/190,996

(22) Filed: Aug. 13, 2008

(65) Prior Publication Data

US 2009/0108884 A1    Apr. 30, 2009

Related U.S. Application Data

(60) Provisional application No. 60/984,180, filed on Oct. 31, 2007, provisional application No. 61/060,362, filed on Jun. 10, 2008.

(51) Int. Cl.
*H03B 1/00* (2006.01)
(52) U.S. Cl. .................. 327/109; 327/536
(58) Field of Classification Search .......... 327/108, 327/109, 536
See application file for complete search history.

(56) References Cited

U.S. PATENT DOCUMENTS

| | | | | |
|---|---|---|---|---|
| 3,736,522 A * | 5/1973 | Padgett | ............ | 330/269 |
| 4,390,803 A * | 6/1983 | Koike | ............ | 327/108 |
| 4,491,748 A * | 1/1985 | Chappell et al. | ............ | 327/112 |
| 5,359,244 A * | 10/1994 | Hopkins | ............ | 327/434 |
| 6,366,124 B1 * | 4/2002 | Kwong | ............ | 326/81 |
| 7,372,319 B1 * | 5/2008 | Lee | ............ | 327/536 |
| 2005/0161700 A1 | 7/2005 | Bayer et al. | | |
| 2007/0210782 A1 | 9/2007 | Prexl et al. | | |
| 2008/0084720 A1 | 4/2008 | Thiele et al. | | |
| 2008/0111611 A1 | 5/2008 | Thiele et al. | | |
| 2008/0224736 A1 * | 9/2008 | Terashima | ............ | 327/108 |

* cited by examiner

*Primary Examiner*—Lincoln Donovan
*Assistant Examiner*—William Hernandez
(74) *Attorney, Agent, or Firm*—John J. Patti; Wade J. Brady, III; Frederick J. Telecky, Jr.

(57) ABSTRACT

A high-side boosted gate drive circuit is disclosed. In a particular example, an output driver is described, comprising a switching device configured to selectively conduct current in response to a charge being present at a control terminal for a duty cycle, a charging device configured to deliver charge to the control terminal based on the first duty cycle, a charge control device configured to selectively couple the charging device to deliver charge to the control terminal and to selectively decouple the charging device from the control terminal to charge the charging device, and a discharge control device configured to remove charge from the control terminal.

16 Claims, 16 Drawing Sheets

HIGH SIDE BOOSTED GATE DRIVE CIRCUIT

RELATED APPLICATIONS

This patent claims the benefit of U.S. Provisional Patent Application No. 60/984,180, filed on Oct. 31, 2007, and claims the benefit of U.S. Provisional Patent Application No. 61/060,362, filed on Jun. 10, 2008, the entireties of which are incorporated by reference.

FIELD OF THE DISCLOSURE

This disclosure relates generally to differential amplifier driver circuits and, more particularly, to high side boosted gate drive circuits.

BACKGROUND

Class D amplifiers are popular for signal amplification due to their high efficiency at full power, reduced need for heat sinking, and smaller quiescent currents. Traditional low-voltage (i.e., less than 5V) class D architectures use an n-channel metal-oxide-semiconductor (NMOS) field-effect transistor (FET) on a low side and a p-channel MOS (PMOS) FET on a high side.

NMOS FETs are appealing to use on the high side of the class D amplifier due to their lower drain-source resistance (RDSon) and higher switching speeds, but they require the gate voltage to be higher than the supply voltage. Such a gate voltage is typically provided by bootstrap circuits, which are often used to provide the floating power supply for the high-side switch gate drive. However, bootstrapping in an integrated circuit (IC) often requires extra pins on the IC and components external to the integrated circuit, which raises complexity and cost. Bootstrapping may also be limited by the frequent charging time requirements that conflict with the gate drive operation, especially under varying duty cycle conditions. If the bootstrap capacitor is not adequately charged, the high-side gate drive may even be completely starved of energy and be, therefore, unable to turn on.

SUMMARY

Figure 1:
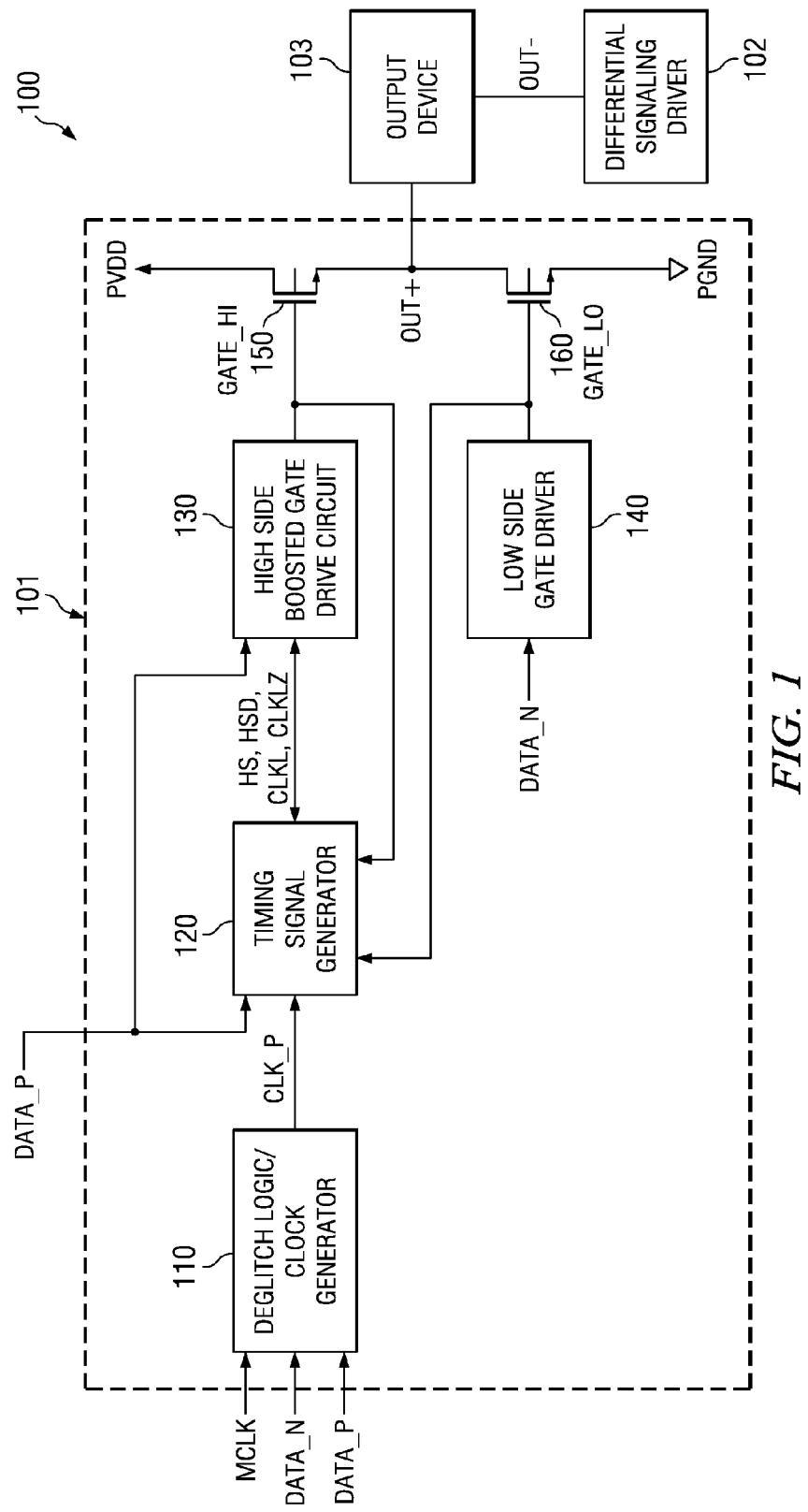
FIG. 1 is a block diagram representative of an example differential amplifier circuit.

High side boosted gate drive circuits are disclosed. In a particular example, a switching device configured to selectively conduct current in response to a charge being present at a control terminal for a duty cycle. A charging device delivers charge to the control terminal based on the first duty cycle. A charge control device is further included, configured to selectively couple the charging device to deliver charge to the control terminal and to selectively decouple the charging device from the control terminal to charge the charging device. Finally, a discharge control device removes charge from the control terminal.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof.

Additionally, it is contemplated that any form of logic may be used to implement portions of apparatus or methods herein. Logic may include, for example, circuit implementations that are made exclusively in dedicated hardware (e.g., circuits, transistors, logic gates, hard-coded processors, programmable array logic (PAL), application-specific integrated circuits (ASICs), etc.), exclusively in software, exclusively in firmware, or some combination of hardware, firmware, and/or software. Accordingly, while the following describes example methods and apparatus, persons of ordinary skill in the art will readily appreciate that the examples are not the only way to implement such apparatus.

As described below, the examples herein may be used to provide a high side boosted gate drive circuit. One example circuit includes a high side laterally diffused metal oxide semiconductor (LDMOS) transistor, a low side LDMOS transistor, and a high side gate drive circuit to drive the high side LDMOS transistor. An example high side gate drive circuit includes a switching device configured to selectively conduct current in response to a charge being present at a control terminal for a duty cycle and a charging device configured to deliver charge to the control terminal to turn on the switching device. A charge control device selectively couples the charging device to deliver charge to the control terminal and selectively decouples the charging device from the control terminal to charge the charging device while keeping the switching device on. A discharge control device removes charge from the control terminal to turn off the switching device. To avoid completely draining the bootstrap capacitor of energy, the circuit charges and/or maintains a charge in the charging device for at least 50% of the clock cycle, regardless of the input and/or output duty cycle.

In another example, a logic circuit is shown and described that allows the example high side boosted gate drive circuit to operate with very low duty cycles. The logic circuit has a master clock input and a deglitch input, and outputs a clock signal based on the master clock input and the deglitch input. For high input duty cycles, the logic circuit outputs a clock signal that tracks the rising and falling edges of the master clock signal. However, for low input duty cycles the output clock signal from the logic circuit has a falling edge that is delayed to provide enough time for the charging device in the high side gate drive circuit to sufficiently discharge. The clock signal output from the logic circuit is used by the example high side gate drive circuit described in FIG. 1 as the clock input signal.

The example circuit implementations described herein may have a reduced layout area by approximately 40% compared to using a traditional p-channel MOSFET for the high side MOSFET in a process such as LBC7. Further, overall quiescent current may be 30% lower than a traditional architecture such as using a p-channel high side MOSFET and an n-channel low side MOSFET.

FIG. 1 is a block diagram representative of an example class-D amplifier circuit 100. The amplifier circuit 100 may be used, for example, to reproduce an input signal with a higher or lower voltage and/or current. The example amplifier circuit 100 includes two differential signaling drivers 101 and 102, the details of which are shown below in FIG. 6. The first differential signaling driver 101 has an output signal OUT+ and the second differential signaling driver 102 has an output signal OUT−. The two output signals OUT+ and OUT− may be used to provide an output device 103 with a differential voltage or current signal. Examples of an output device 103 may be an audio output device, such as a speaker.

The example amplifier circuit 100 may be implemented using an IC, such as a processor chip or a dedicated differential amplifier chip. Further, the differential signaling drivers 101 and 102 may be similar or identical in components and/or configuration. For brevity and clarity, only the differential signaling driver 101 will be described in detail. However, those of ordinary skill in the art will recognize that the inventive concepts may be equally applied to the differential signaling driver 102.

The example differential signaling driver 101 includes a deglitch logic/deglitch logic/clock generator 110, a timing signal generator 120, a high side boosted gate drive circuit 130, and a low side gate driver 140. The differential signaling driver 101 further includes a high side n-channel MOSFET 150, which is driven by the high side boosted gate drive circuit 130, and a low side n-channel MOSFET 160, which is driven by the low side gate driver 140.

The example differential signaling driver 101 receives three input signals and has one output signal (OUT+). The example input signals are a master clock signal (MCLK) and a pulse-width modulated (PWM) input data signals (DATA_P and DATA_N). The example DATA_P and DATA_N signals are PWM signals of the type generated in a Class-D amplifier, having a duty cycle based on a comparison of a integrated differential signal and a high-frequency ramp signal. The MCLK signal may be a standard clock signal having a 50% duty cycle (i.e., active logic level for 50% of the clock cycle). The DATA_P signal may be one signal from a pair of PWM signals, where the corresponding input signal DATA_N is used by the differential signaling driver 102. Alternatively, the DATA_P signal may be a one-sided signal. Further, the duty cycle of DATA_P determines the duty cycle of OUT+.

The deglitch logic/clock generator 110 deglitches the DATA_P signal and generates a clock signal (CLK_P) for use in the timing signal generator 120 from the MCLK signal and the DATA_P signal(s). During normal operation, the high side boosted gate drive circuit 130 tolerates only one DATA_P pulse per MCLK cycle. Any glitch pulses that may occur on the DATA_P signal are filtered out by the deglitch logic/clock generator 110. For high DATA_P and OUT+ duty cycles (e.g., duty cycles greater than approximately 50%), the example deglitch logic/clock generator 110 outputs the CLK_P signal such that CLK_P is equal or substantially equal to MCLK. However, for low DATA_P and OUT+ duty cycles (e.g., between approximately 1% and 50%), the example deglitch logic/clock generator 110 shifts the falling edge of the CLK_P signal in a time-delayed manner relative to MCLK. The shift in the falling edge of the CLK_P signal allows the bootstrap capacitor of the high side boosted gate drive circuit 130 to charge and discharge properly at low duty cycles. It is noted that the definition of a "high" or a "low" duty cycle may change depending on the specific implementation of the differential signaling driver 101.

As described in detail below, the timing signal generator 120 generates timing signals for use in the high side boosted gate drive circuit 130. The generated timing signals may include a CLKL signal, a CLKLZ signal, an HS signal, and an HSD signal. The timing signal generator 120 generates the example timing signals based on combinations of the CLK_P signal, the DATA_P signal, and feedback signals from the high side boosted gate drive circuit 130, using a combination of logic gates and voltage level-shifting circuitry. Example feedback signals include a GATE_HI signal and a GATE_LO signal, which control the high side n-channel MOSFET 150 and low side n-channel MOSFET 160, respectively.

The high side boosted gate drive circuit 130 generates the control signal GATE_HI, which controls the state of the high side n-channel MOSFET 150 (e.g., on or off). As explained below, due to the high gate voltage requirement of the high side n-channel MOSFET 150, the example high side boosted gate driver includes a bootstrapping circuit, which generates a sufficient voltage to drive GATE_HI such as to turn on the high side n-channel MOSFET 150. The timing signals generated by the timing signal generator 120 and the DATA_P signal are used by the high side boosted gate drive circuit 130 to charge energy to and discharge energy from the bootstrapping circuit by selectively switching combinations of switching elements (e.g., transistors) on and off, and further guarantees that the bootstrapping circuit charges with energy and/or maintains a charge for at least 50% of the clock cycle, regardless of the DATA_P duty cycle.

The n-channel MOSFETs 150 and 160 of the example amplifier circuit 100 are output LDMOS transistors included as part of the IC on which the example differential signaling driver 101 is implemented. The power n-channel MOSFETs 150 and 160 are designed to allow relatively large currents and/or voltage differences between the drain, source, and gate terminals. Although the example n-channel MOSFETs 150 and 160 are implemented using LDMOS transistors, any suitable device may be used to provide OUT+ with sufficient current and/or voltage to one or more output devices (e.g., the output device 103). Either or both of the n-channel MOSFETs 150 and/or 160 may be implemented in the IC or external to the IC, using discrete components, additional ICs, or some combination thereof.

Figure 2:
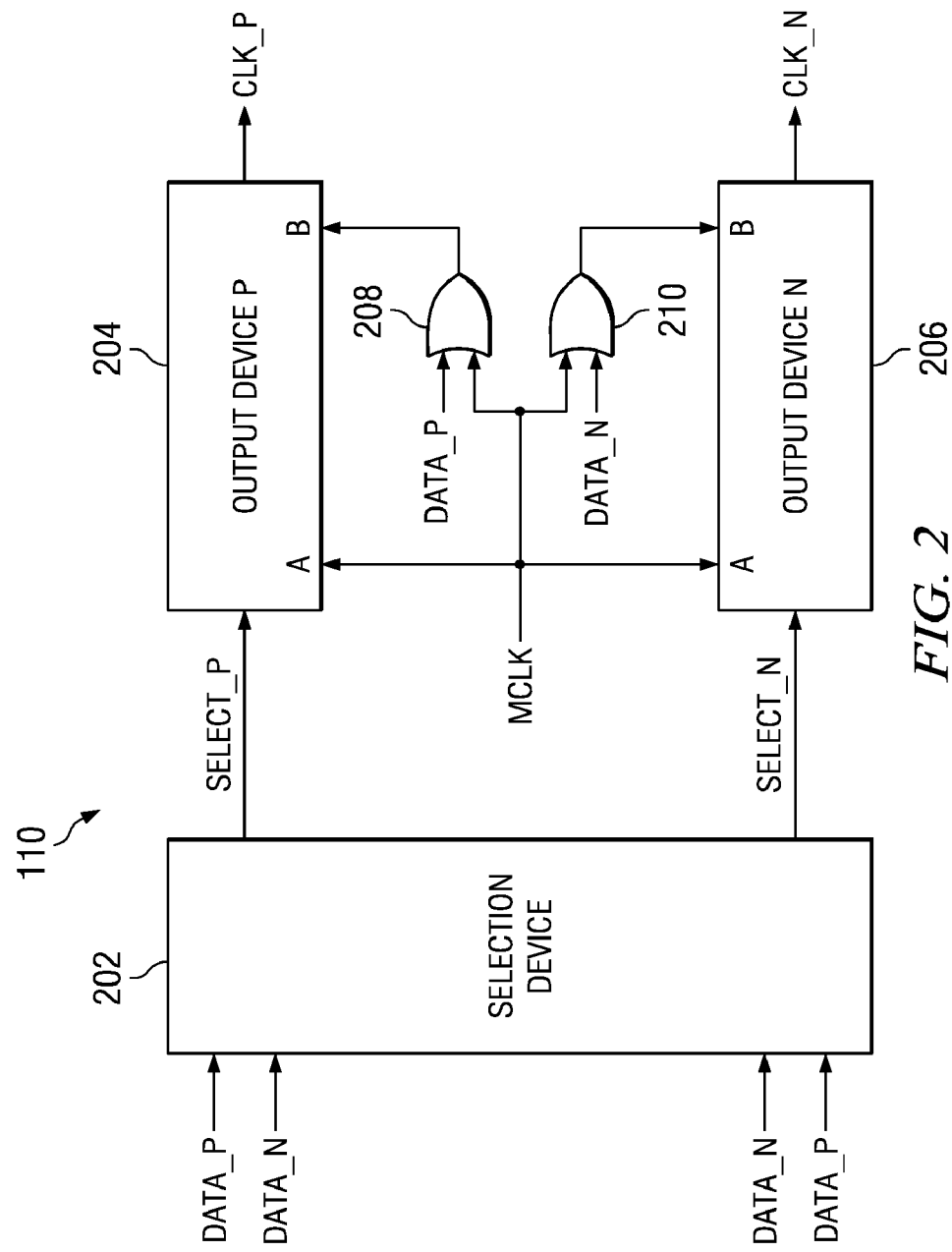
FIG. 2 is a block diagram of an example circuit to implement the deglitch logic/clock generator of FIG. 1.

FIG. 2 is a block diagram of an example circuit 200 to implement the deglitch logic/clock generator 110 of FIG. 1.

The circuit 200 generates an output clock CLK_P to be used by the high side gate drive circuit 130 of FIG. 1 and an output clock CLK_N to be used by the low side gate driver 140. The example circuit 200 includes a selection device 202 to generate respective selection signals (SELECT_P and SELECT_N). The selection signals are used as selection inputs to output devices 204 and 206 to determine one of two data inputs to output as the CLK_P and CLK_N signals. For example, the output device P 204 outputs a master clock signal MCLK or the output of an OR gate 208 as the CLK_P signal depending on SELECT_P. Similarly, the output device N 206 outputs the master clock signal or the output of another OR gate 210 as the CLK_N signal depending on SELECT_N.

The deglitch logic/clock generator 110 generates the clock signals CLK_P and CLK_N based on the duty cycles of DATA_P and DATA_N. For DATA_P duty cycles greater than 50%, the example circuit 200 selects the MCLK signal to use as the CLK_P signal via the output device P 204. The selection device 202 generates SELECT_P depending on the sequence of falling edges on the DATA_P and DATA_N signals. Depending on the duty cycles of each DATA signal, the DATA_P or the DATA_N signal will have a falling edge first in a given MCLK clock cycle, followed by a falling edge on the other DATA signal. The DATA (e.g., DATA_N) signal that has the falling edge first has the duty cycle larger than 50% and, thus, the selection device 202 causes the corresponding output device 204 or 206 to pass through the MCLK signal. In contrast, the other DATA signal (e.g., DATA_N) has a duty cycle less than 50% and the selection device 202 causes the corresponding output device 204 or 206 to delay the falling edge of the output clock signal.

Figure 3A:
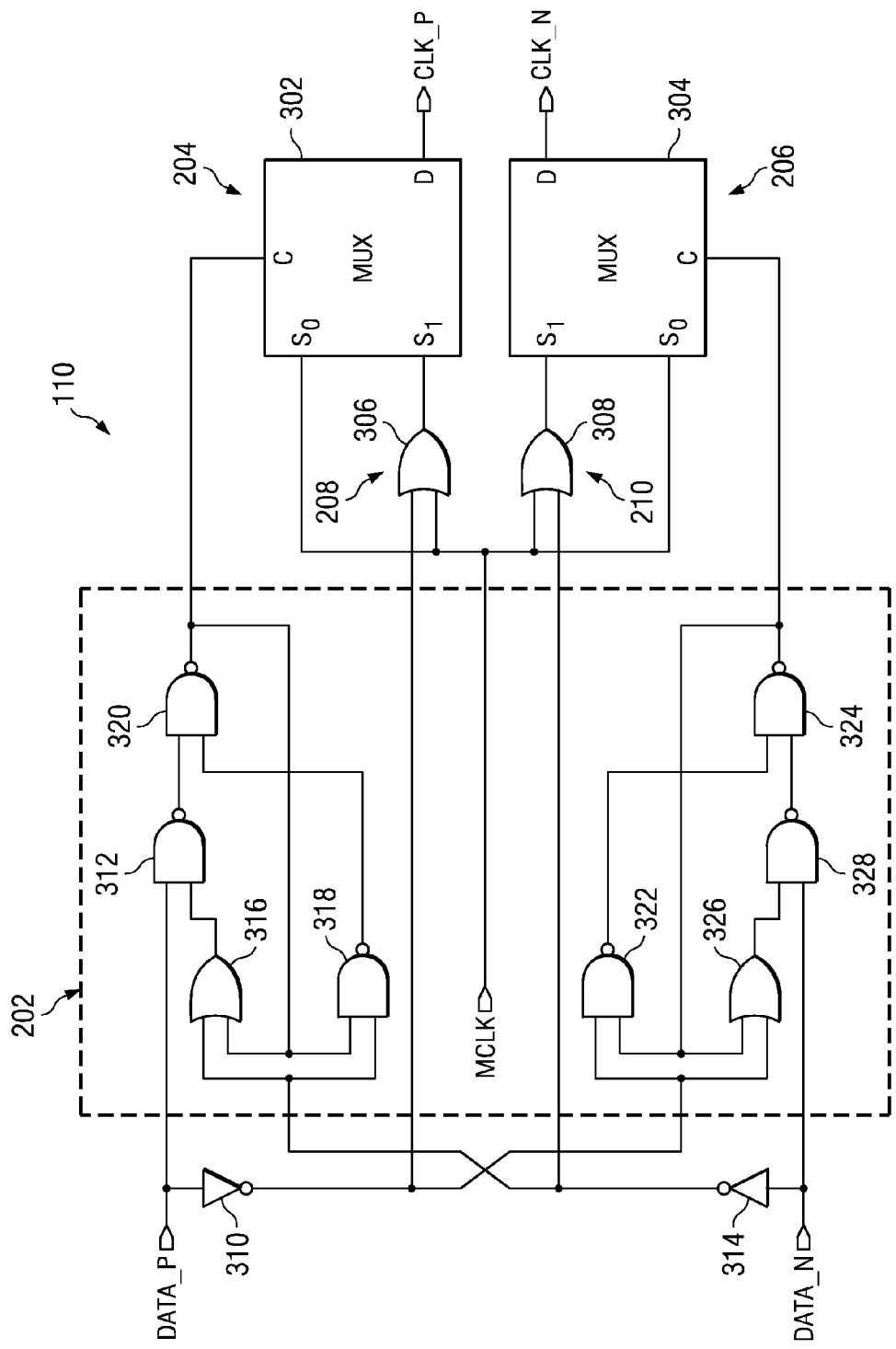
FIG. 3A is a schematic diagram of an example circuit to implement the deglitch logic/clock generator of FIG. 1.

FIG. 3A is a schematic diagram of an example logic circuit 110 to implement the deglitch logic/clock generator 110 described in FIG. 1. The example logic circuit 110 utilizes several logic gates including NOT gates, OR gates, and NAND gates, as well as multiplexers. As described above in connection with FIG. 1, the logic circuit 110 has a master clock input MCLK and PWM data inputs DATA_P and DATA_N. MCLK has a constant or substantially constant 50% duty cycle, which may be provided by an internal oscillator circuit or an external source.

The example DATA_P and DATA_N signals are PWM input signals based on respective high-speed comparator outputs (not shown). The inputs to the comparators are an integrated differential input signal and a triangle wave corresponding to the MCLK signal. For example, the differential signaling driver 101 is designed so the falling CLK_P edge is centered between the rising and falling edges of the OUT+ signal. As described below, the CLK_P output signal only changes state in response to MCLK changing state. The state of the DATA_N signal does not affect the CLK_P signal unless MCLK changes state from logic high to logic low. In such a case, an active (logic low) DATA_N signal prevents a change in the state of the CLK_P signal, delaying CLK_P from following MCLK to logic low until DATA_N returns to logic high. This delay effect only occurs during very low DATA_P duty cycles, and allows a charge pump capacitor to properly discharge energy as described below in FIG. 6.

Glitch pulses on the DATA_P and DATA_N signals may occur at any time. The logic circuit 110, in combination with the timing signal generator 130 of FIG. 1, prevents the DATA_P and DATA_N signal pulses from affecting the OUT+ signal unless the MCLK signal has a falling edge during a pulse (i.e., the pulse occurs at the proper time).

The output devices 204 and 206 of the example circuit 200 shown in FIG. 2 are implemented using multiplexers 302 and 304. The MCLK signal is used as an input to $S_0$ input terminals of multiplexers 302 and 304. The input signal to the $S_0$ terminal of the multiplexers 302 and 304 is used as a corresponding output (e.g., the D output terminal of the multiplexers 302 and 304) when a logic low (i.e., logic 0) is input to a selection terminal (e.g., the C input terminal of the multiplexers 302 and 304). Conversely, an input signal to an $S_1$ terminal is used as the output D when the input to the selection terminal C (e.g., SELECT_P or SELECT_N of FIG. 2) is a logic high (i.e., logic 1). The MCLK signal is further input to OR gates 306 and 308, which have outputs that are used as inputs to the $S_1$ terminals of the multiplexers 302 and 304, respectively.

The DATA_P signal is input to a first NOT gate 310 and to a NAND gate 312. An output of the NOT gate 310 is used as a second input to the OR gate 306. The DATA_N signal is input to a second NOT gate 314 and to a NAND gate 316. An output of the NOT gate 314 is used as a second input to the OR gate 308, as an input to an OR gate 316, and as an input to a NAND gate 318. An output of the OR gate 316 is used as a second input to the NAND gate 312. An output of the NAND gate 312 is used as a first input to another NAND gate 320, and an output of the NAND gate 318 is used as the second input to the NAND gate 320. An output of the NAND gate 320 is used as the second input to the OR gate 316, as the second input to the NAND gate 318, and as the selection input C to the multiplexer 302.

A similar configuration is constructed for the selection input C of the multiplexer 304 using NAND gates 322, 324 and 328, and OR gate 326. An output of the NAND gate 324 is fed back to be used as inputs to the NAND gate 322 and the OR gate 326, and is also used as the selection input C for the multiplexer 304.

The example logic gates 312, and 316-320, and 322-328 are used to implement the selection device 202 described in FIG. 2 to generate the SELECT_P and SELECT_N signals (e.g., the C inputs to the multiplexers 302 and 304). Further, the OR gates 306 and 308 may be used to implement the OR gates 208 and 210, respectively, to generate inputs to the multiplexers 302 and 304.

The output of the multiplexer 302 is CLK_P, which is used as the CLK_P signal for the timing signal generator 130 and the high side boosted gate drive circuit 130 of the differential signaling driver 101. Similarly, the output of the multiplexer 304 is CLK_N, which is used as the CLK_P signal for a corresponding timing signal generator and a corresponding high side boosted gate drive circuit for the differential signaling driver 102.

The example multiplexers 302 and 304 and the logic gates 306-328 of the deglitch logic/clock generator 110 may be integrated into the IC on which the remainder of the differential signaling driver 101 is located. Additionally or alternatively, any or all of the components of the deglitch logic/clock generator 110 may be implemented using discrete components, additional ICs, or some combination thereof. Although an example logic circuit 110 is shown in FIG. 3, any other type of logic may be used to generate and/or manipulate a clock signal to provide a high side boosted gate driver circuit with the described CLK_P signal. Further, the deglitch logic/clock generator 110 may be implemented using any combination of IC and/or discrete components, or may be additionally or alternatively implemented using firmware and/or software.

In operation, the example logic circuit 110 delays the falling edge of the CLK_P signal when DATA_P has a low duty cycle (e.g., less than 50%) and delays the falling edge of the CLK_N signal when DATA_N has a low duty cycle. In this example, the DATA_N signal and DATA_N signal are active low signals. As shown below in FIGS. 9-11, the MCLK signal has a falling edge approximately halfway between the rising edge and the falling edge of OUT+. Thus, when OUT+ has a high duty cycle, the falling edge of CLK_P is far from the rising edge of OUT+ and the DATA_P and DATA_N. In this case, CLK_P tracks the MCLK signal.

In the example case that the duty cycle of DATA_P is greater than 50%, the duty cycle of DATA_N is less than 50% as shown by Equation 1:

$$d_{DATA\_N} = 100\% - d_{DATA\_P} \quad \text{(Eq. 1)}$$

where d is the duty cycle in percent. As a result, the state of DATA_P changes from logic high to logic low, followed by a change in the state of DATA_N from logic high to logic low, and then followed by the falling edge of MCLK. In this example, the logic to generate the output CLK_P signal (i.e., the multiplexer 302 and the gates 306, and 310-320) will illustrate generating the CLK_P signal for a duty cycle greater than 50%. The logic to generate the CLK_N signal (i.e., the multiplexer 304 and the gates 308, 310, 314, and 322-328) will illustrate generating a delayed CLK_N signal. It is to be understood that for DATA_N duty cycles of less than 50%, the behavior of the logic may be interchanged due to the symmetrical nature of the example logic circuit 110.

Figure 3B:
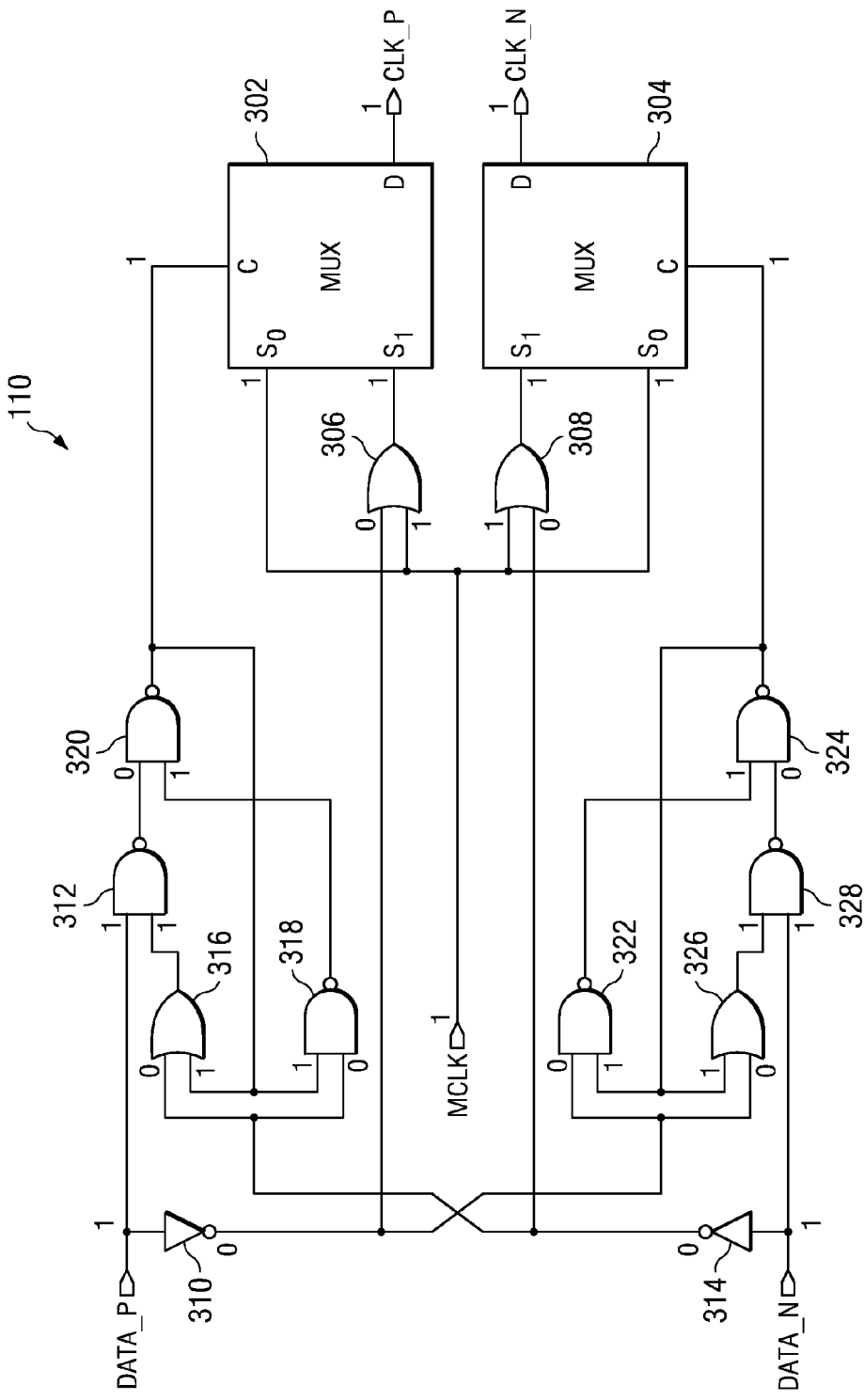
FIGS. 3B-3G are schematic diagrams of the circuit shown in FIG. 3A during operation for an example sequence of logic states.

The initial states of the NAND gates 320 and 324 may be logic low and/or logic high from a previous clock cycle, but the initial states do not affect the net result of the logic sequence shown in FIGS. 3B-3G, which is to delay the CLK_P or CLK_N signal based on input signal DATA_P or DATA_N that has a duty cycle less than 50%. FIG. 3B illustrates the state of the example logic circuit 110 with the DATA_P, DATA_N, and MCLK input signals, and the output states of the NAND gates 320 and 324 at logic high (i.e., 1). Due to the MCLK signal, both S0 and S1 inputs are high at each multiplexer 302 and 304, and therefore both CLK_P and CLK_N signals are logic high (to match MCLK).

Figure 3C:
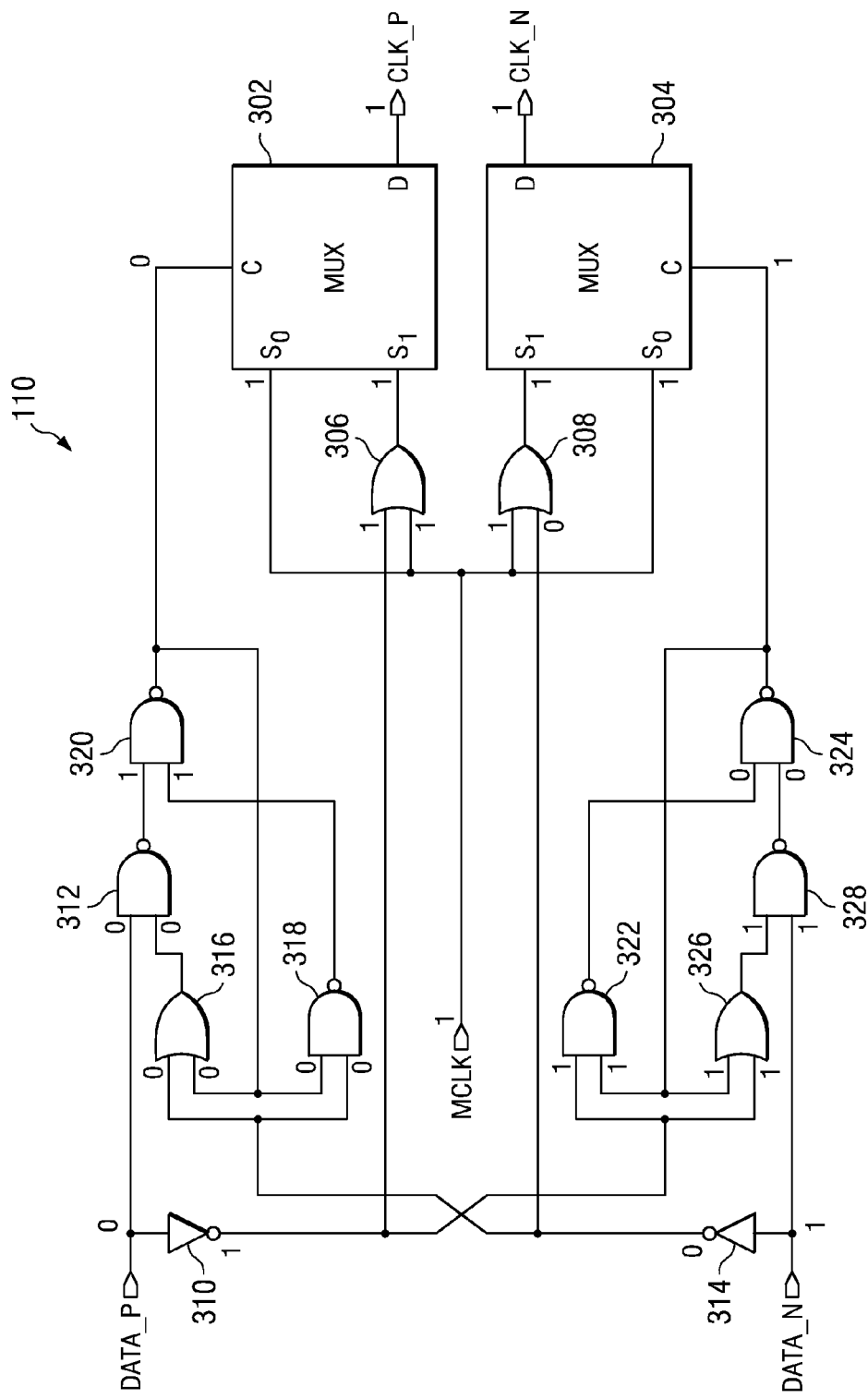

From FIG. 3B to FIG. 3C, DATA_P changes state from logic high to logic low (i.e., 0). As a result, the output states of the intermediate gates 310, 312, 316, 320, and 322 change, and the selection input C to the multiplexer 302 changes to S_0.

Figure 3D:
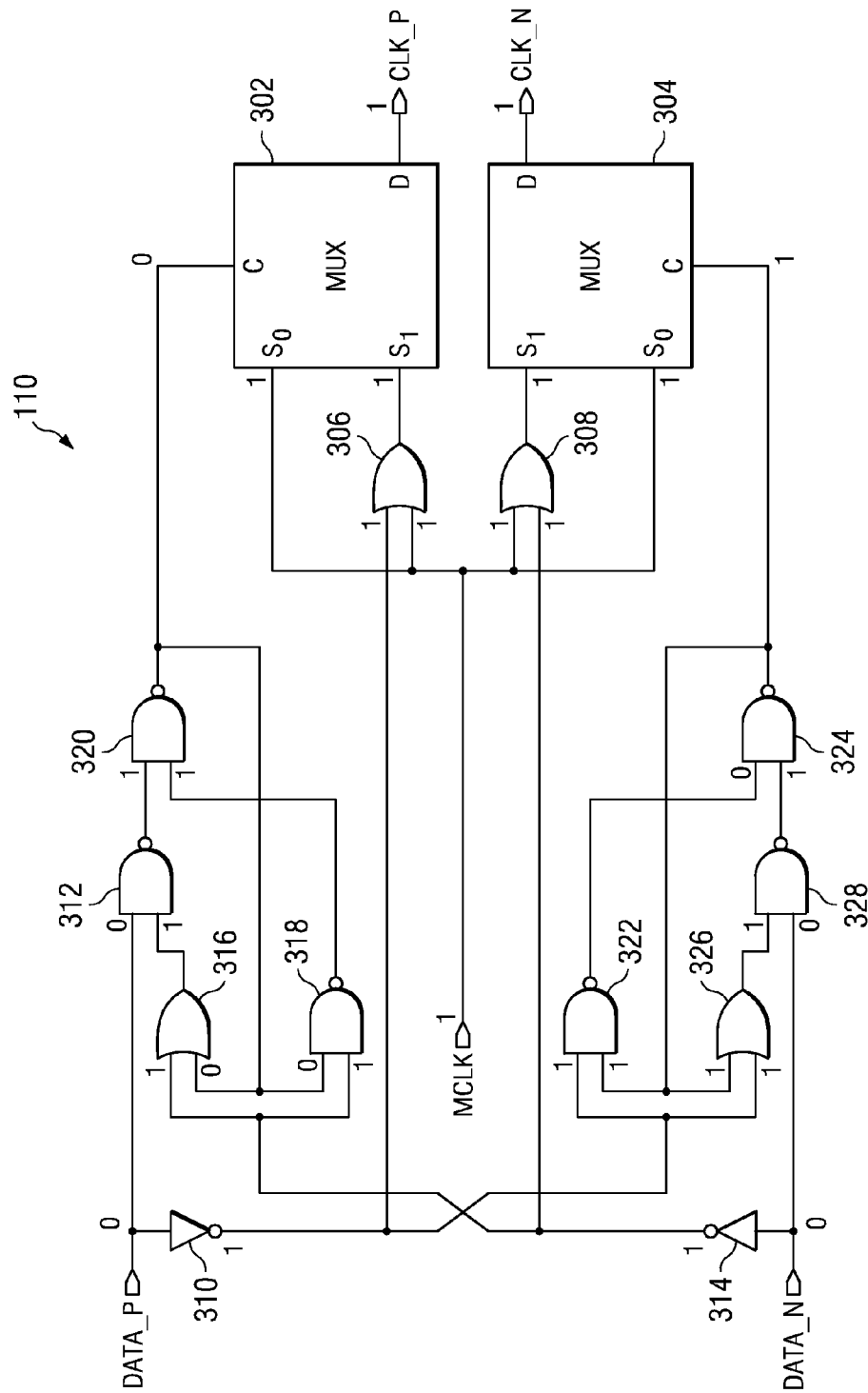

From FIG. 3C to FIG. 3D, DATA_N changes state from logic high to logic low. This causes intermediate gates 314, 316, and 328 to change state, and causes an input of the OR gate 308 to change from low to high. As a result, when MCLK changes state from high to low, the $S_1$ inputs of the multiplexers 302 and 304 remain at logic high.

Figure 3E:
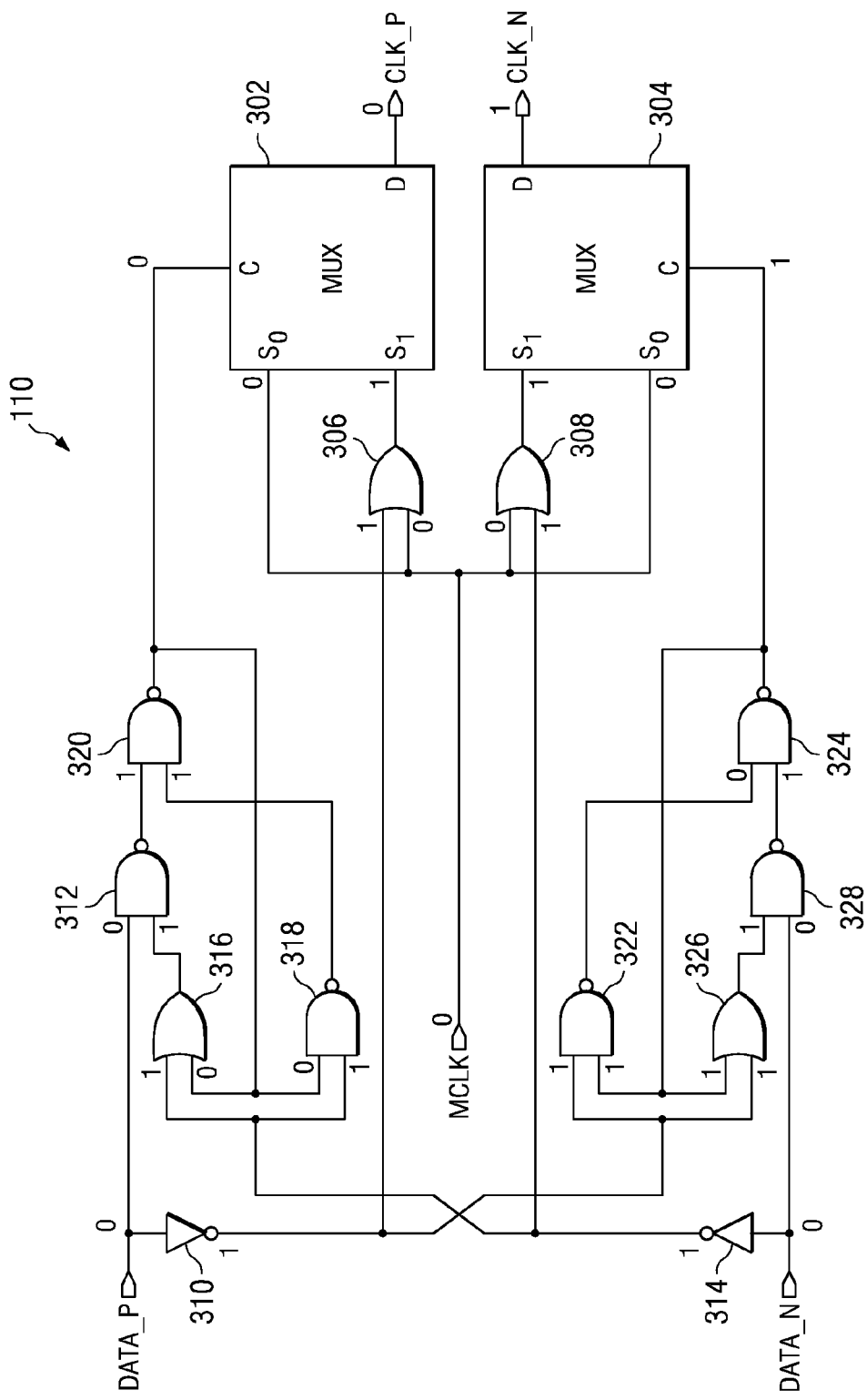

From FIG. 3D to FIG. 3E, MCLK reaches a falling edge and changes states from high to low. No intermediate gates change states, but the S0 inputs to the multiplexers 302 and 304 change to logic low. Thus, the output clocks CLK_P and CLK_N are dependent on the selection inputs C, respectively. The C input to the multiplexer 302 is logic low, causing CLK_P to go low in response to MCLK going low when DATA_P has a duty cycle higher than 50%. In contrast, the C input to the multiplexer 304 is logic high, and CLK_N remains at logic high when MCLK reaches a falling edge.

Figure 3F:
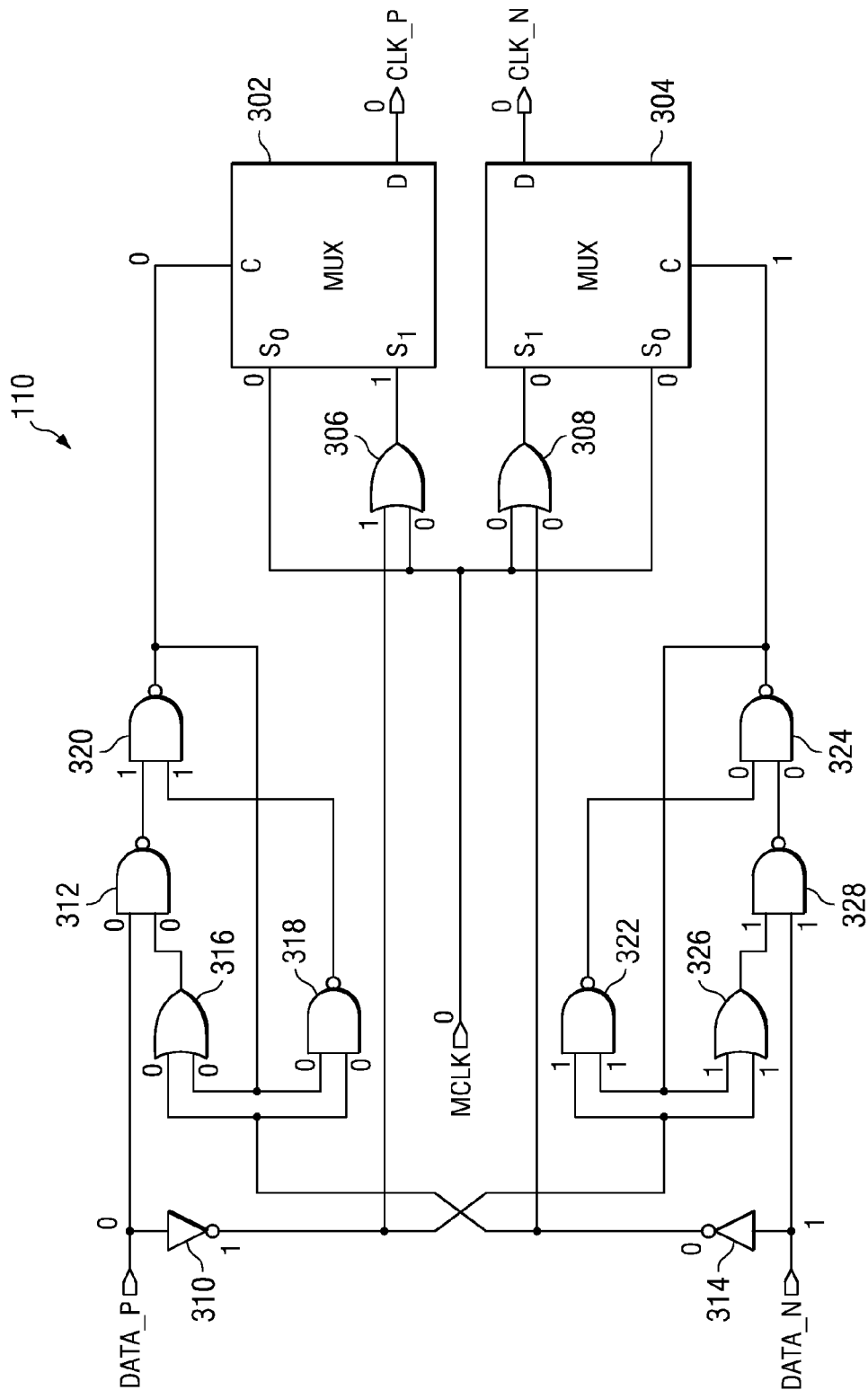

From FIG. 3E to FIG. 3F, DATA_N changes states from logic low to logic high. The resulting state change in the intermediate gates 308 and 314 causes the S1 input of the multiplexer 304 to fall to logic low. Because both inputs to the multiplexer 304 are logic low, the output CLK_N falls to logic low and results in a delayed clock signal.

Figure 3G:
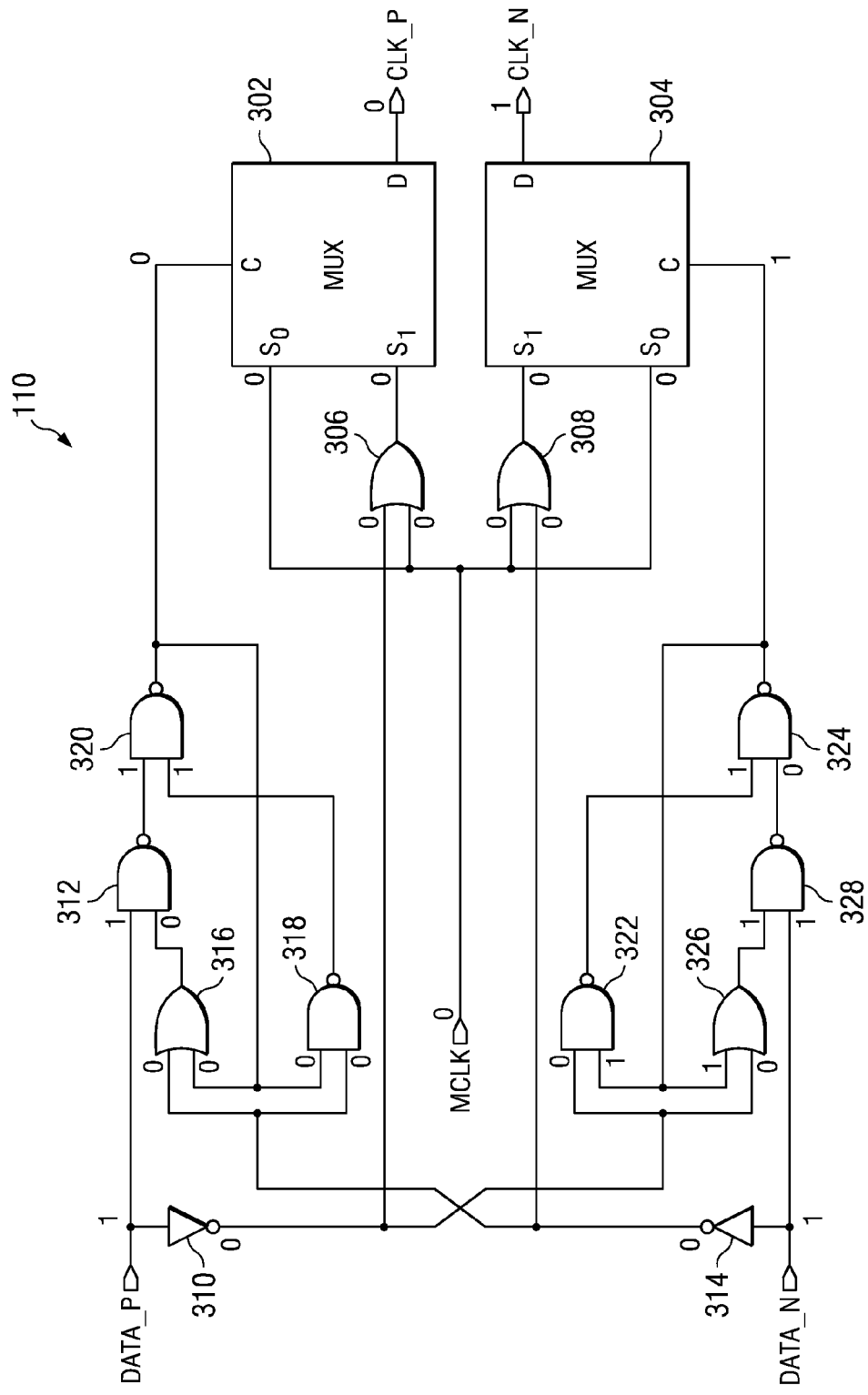

From FIG. 3F to FIG. 3G, the DATA_N signal changes states from logic low to logic high. The DATA_P state change also causes a state change in intermediate gates 306, 310, and 322, and the $S_1$ input of the multiplexer 302 changes to logic low.

As mentioned above, the logic sequence shown in FIGS. 3B-3G may also occur in a mirrored sequence, wherein DATA_P has a duty cycle less than 50% and DATA_N has a duty cycle greater than 50%. In this case, the falling edge of the CLK_P signal is delayed until the rising edge of the DATA_N signal in the same manner as the CLK_N signal is delayed in the example sequence described above.

For DATA_P and DATA_N duty cycles of 50%, the logic circuit 110 delays both CLK_P and CLK_N signals until the rising edges of DATA_N and DATA_N, respectively. The delay functionality of the deglitch logic/clock generator circuit 110 is further shown and described in connection with FIGS. 7-11.

Figure 4:
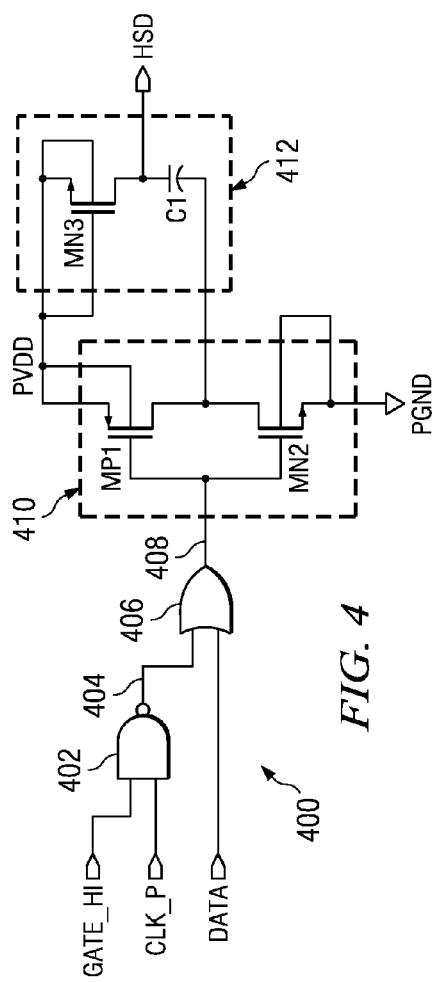
FIG. 4 is a schematic diagram of an example circuit to generate the timing signal for use in the high side boosted gate drive circuit described in FIG. 1.

FIG. 4 is a schematic diagram of an example circuit 400 to generate the timing signal HSD for use in the high side boosted gate drive circuit 130 described in FIG. 1. The example circuit 400 may be implemented as part of the timing signal generator 120 described in FIG. 1. The HSD signal is used by the high side boosted gate drive circuit 130 to charge and discharge the capacitor. As described below in FIG. 6, the HSD signal drives a MOSFET to couple the capacitor to the output MOSFET gate.

To generate the HSD signal, the GATE_HI and CLK_P signals are input into a NAND gate 402. The output 404 of the NAND gate 402 is then input to an OR gate 406 with the DATA_N signal. Then, the output 408 of the OR gate 406 is input to an inverting circuit 410 and a voltage-level shifting circuit 412. The example inverting circuit 410 inverts the output 408 of the OR gate 406 using p-channel MOSFET MP1 and n-channel MOSFET MN2. The voltage level-shifting circuit 412, which includes an n-channel MOSFET MN3 and a capacitor C1, increases maximum voltage of the HSD signal from PVDD to 2*PVDD.

Figure 5:
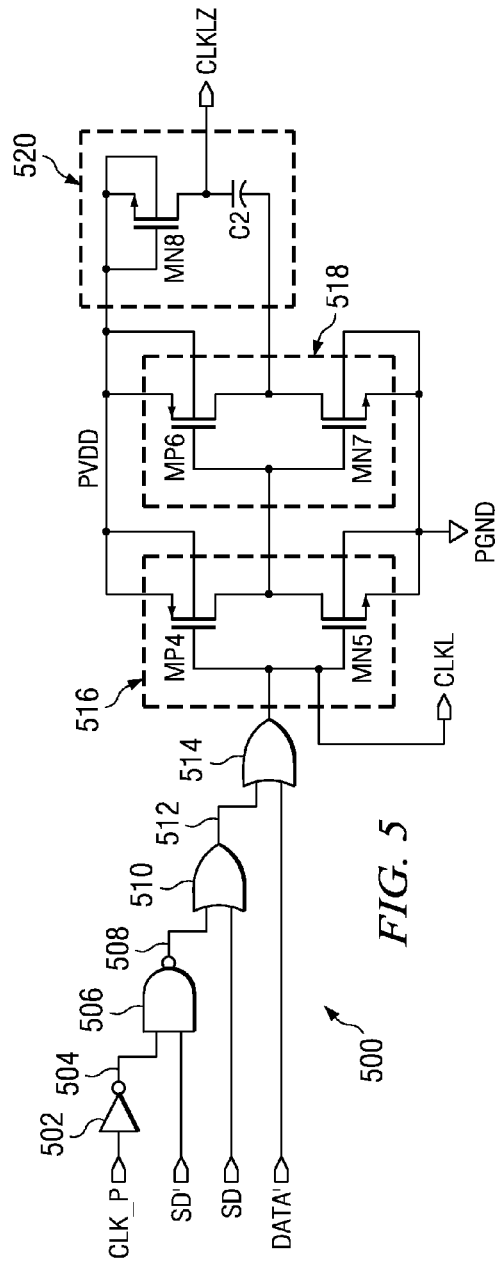
FIG. 5 is a schematic diagram of an example circuit to generate the CLKL and CLKLZ timing signals for use in the high side boosted gate drive circuit described in FIG. 1.

FIG. 5 is a schematic diagram of an example circuit 500 to generate the CLKL and CLKLZ timing signals for use in the high side boosted gate drive circuit 130 described in FIG. 1. The example circuit 500 may be implemented as part of the timing signal generator 120 described in FIG. 1. The circuit 500 utilizes the CLK_P signal from the deglitch logic/clock generator 110 of FIG. 1, a DATA' signal, which is the inverse signal of DATA, a shutdown signal SD, and the inverse of the shutdown signal, SDZ. The shutdown signals SD and SD' may be used as indicators that the remainder of the circuitry (e.g., the processing component) of the example IC is shutting down. However, in operation the SD and SD' signals are constant and, thus, have no effect on the CLKL and CLKLZ signals.

To generate the CLKL and CLKLZ signals, the example circuit 500 receives the CLK_P signal and inputs it into a NOT gate 502. An output 504 of the NOT gate 502 is input to a NAND gate 506 with the SD' signal, which is a logic high in the current example. An output 508 of the NAND gate 506 is input to an OR gate 510 with the SD signal. The OR gate 510 provides an output 512, which is then input to an OR gate 514 with DATA'.

The output of the OR gate 514 is used as the CLKL signal in the high side boosted gate drive circuit 130, as described below in FIG. 6. CLK_PL is then input into a first inverter circuit 516, the output of which is then input into a second inverter circuit 518. The resulting output of the second inverter circuit 518 is a logic level equal to that of CLKL, which is then voltage level-shifted by a level-shifting circuit 420 to generate CLKLZ. CLKL and CLKLZ have the same logic symbol at any given time and, thus, turn the same type of MOSFET (e.g., n-channel) on and off at the same or substantially the same time. The level-shifting circuit 520 increases the maximum voltage of the CLKLZ signal from PVDD to 2*PVDD.

It is noted that the NOT gate 502 may be omitted from the example circuit 500 by providing the NAND gate 506 with the inverse CLK_P signal from an alternative location. Additionally, if the SD and SD' signals are not desired in a particular implementation, the NOT gate 502, the NAND gate 506, and the OR gate 510 may be omitted by inputting the CLK_P signal directly into the OR gate 514 instead of the output 512 of the OR gate 510.

Figure 6:
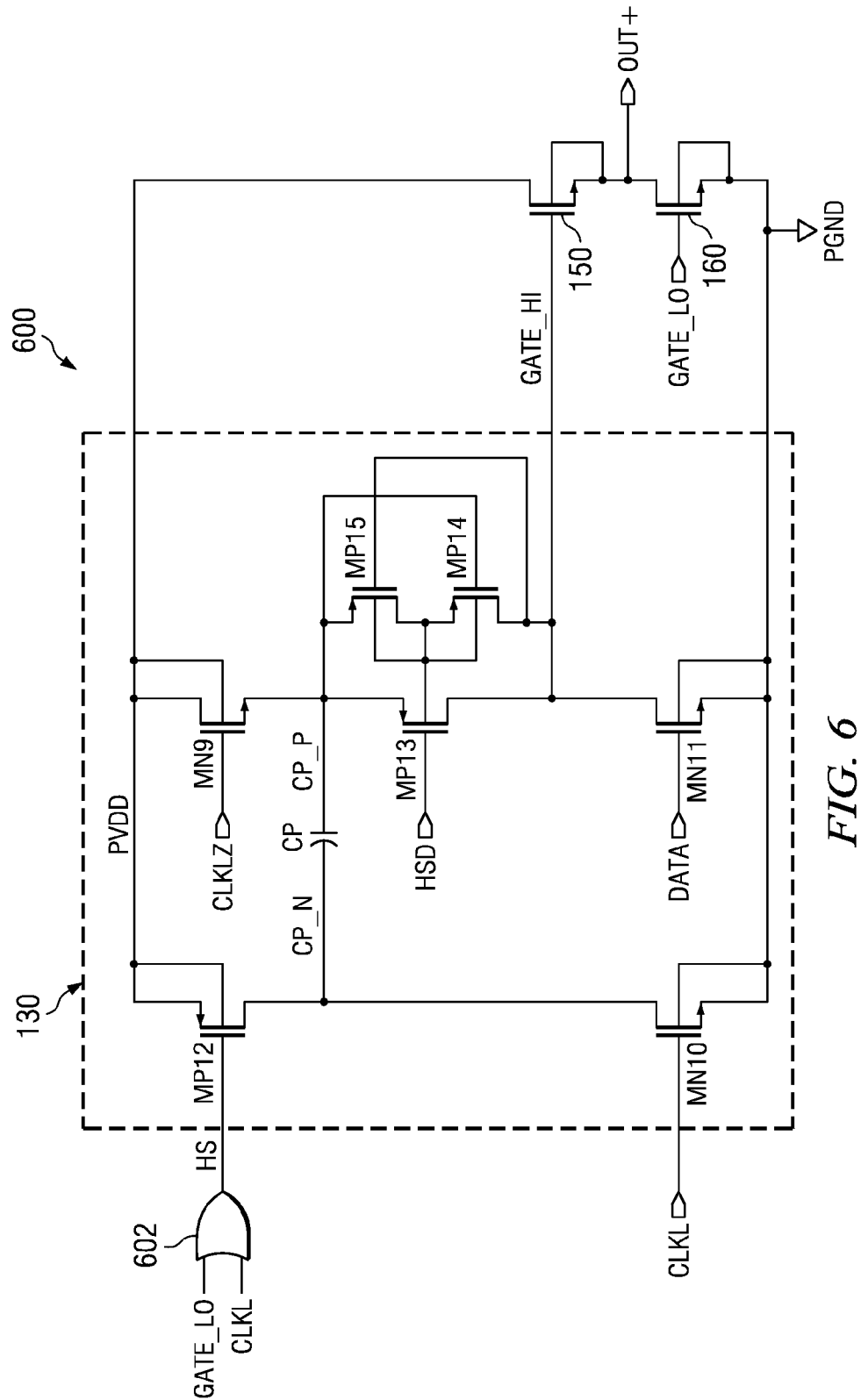
FIG. 6 is a schematic diagram of an example differential output driver including the high side boosted gate drive circuit of FIG. 1.

FIG. 6 is a schematic diagram of an example differential output driver 600. The example differential output driver 600 includes the example high side boosted gate drive circuit 130 described in FIG. 1, which may be used to provide a control (i.e., gate) voltage to a switching device, such as the high side n-channel MOSFET 160, based on the PWM input signal DATA_N. The high side n-channel MOSFET 160 and the low side n-channel MOSFET are alternately turned on and off (i.e., conducting current and restricting current, respectively) to raise and lower the voltage at OUT+, which provides a voltage to an output device. The high side n-channel MOSFET 160 is controlled by applying the voltage GATE_HI to the control terminal of the MOSFET 160 as described herein. The low side n-channel MOSFET 160 is controlled by applying the signal GATE_LO to a control terminal of the MOSFET 160.

The example high side boosted gate drive circuit 130 includes a charging device, implemented as a capacitor CP, which has a terminal CP_P and a terminal CP_N. The capacitor CP is charged and discharged by selectively switching transistors MN9, MN10, MN11, MP12, and/or MP13 on and off. The transistors MN9, MN10, and MP12 are used to implement a charge pump, which can generate a voltage at CP_P greater than the supply voltage PVDD. The transistor MP13 is used to implement a charge control device to control delivery of charge from the charging device CP to the control terminal of the switching device. The transistor MN11 is used as a discharge device to selectively discharge the control terminal of the switching device. Although an example implementation of the switching device, charging device, charge pump, charge control device, and discharge device are described, it should be recognized that other implementations are possible and fall within the scope of the inventive concept.

Depending on the transistors that are on and off at a given moment, CP is charged by a voltage supply PVDD and a ground reference PGND, or discharges to provide GATE_HI with sufficient charge to turn on the high side n-channel MOSFET 160. The transistor MN9 has a source terminal coupled to the CP_P terminal, a drain terminal coupled to PVDD, and a backgate terminal coupled to PVDD. The level-shifted timing signal CLKLZ is coupled to a gate terminal to control the state of MN9 (i.e., on or off). As described below, the CP_P terminal voltage may fluctuate between PVDD and 2*PVDD based on the voltage applied at CP_N. The transistor MN10 selectively couples the CP_N terminal to PGND based on the timing signal CLKL. As described above, the example CLKL and CLKLZ signals increase and decrease voltage at substantially the same times. However, as described above in FIG. 5 and shown in FIGS. 9-11, CLKLZ is shifted to a different voltage range than CLKL. The example transistor MN11 is controlled at a gate terminal by the DATA_P signal. A drain terminal of MN11 may reach a voltage of up to 2*PVDD, and a source terminal is coupled to PGND.

In the example of FIG. 6, the HS signal is generated from the output of an OR gate 602, using the CLKL signal and the GATE_LO signal as inputs. The HS signal is then used as an input to a gate terminal of the transistor MP12 to selectively couple CP_N to PVDD. The backgate connection of MP13 is coupled to CP_P and GATE_HI via p-channel transistors MP14 and MP15, which are coupled so as to function in a blocking diode configuration. The illustrated configuration provides for changing the backgate connection for MP13 depending on the relative voltages of $CP_{13}$ P and GATE_HI. The operation of the example high side boosted gate drive circuit 130 is described below in connection with FIGS. 9-11.

As noted above, the HS, CLKL, CLKLZ and HSD signals are generated to guarantee that CP will be charged for at least 50% of the clock cycle. The timing signal generator 120 generates the timing signals based on the CLK_P, DATA, and GATE_HI signals such that charging of CP begins at the falling edge of CLK_P, and does not end until after the rising edge of CLK_P. Thus, as shown below in connection with FIGS. 9-11, with a CLK_P duty cycle of 50%, CP is guaranteed to charge for at least 50% of each clock cycle.

In the example high side boosted gate drive circuit 130, the transistors MN9 and MN10 are isolated 7V n-channel MOSFETs included in the IC package. However, any appropriate devices may be used to selectively couple PGND to CP_N and/or PVDD to CP_P, where the devices support the applicable currents and/or voltages without damage. Due to the relatively high voltages seen by the terminals of MN11, an extended drain n-channel MOSFET is used, which is constructed as part of the IC. However, other devices may also be used, provided the transistor can support the voltages at the drain-source terminals.

The example transistors MP12 and MP13 are implemented using 7V p-channel MOSFETs included in the IC. MP14 and MP15 as shown in the example generally have lower voltage requirements than MP12 and MP13. The transistors MP12-MP15 may be implemented using the same or substantially the same types and/or sizes of p-channel transistor, or one or more transistors may be implemented using a different type of transistor. Additionally or alternatively, one or more of the transistors may be implemented using one or more additional ICs, one or more discrete component, or some combination thereof.

The example charging device capacitor CP is a high-density bootstrap capacitor included in the IC with the other components of the high side boosted gate drive circuit 130. The capacitance of CP is chosen to provide sufficient energy to GATE_HI and the gate of high side n-channel MOSFET 160. However, any bootstrap capacitor or other energy storage device may be used to implement the charging device, provided there is sufficient energy storage capacity and the energy storage device can support voltages up to 2*PVDD. Other example capacitors include capacitors included in the IC package and external capacitors, such as plastic film, ceramic, and/or electrolytic. Further, single or multiple capacitors may be used in series or in parallel to achieve a desired capacitance value, voltage tolerance, and/or other characteristic.

Figure 7:
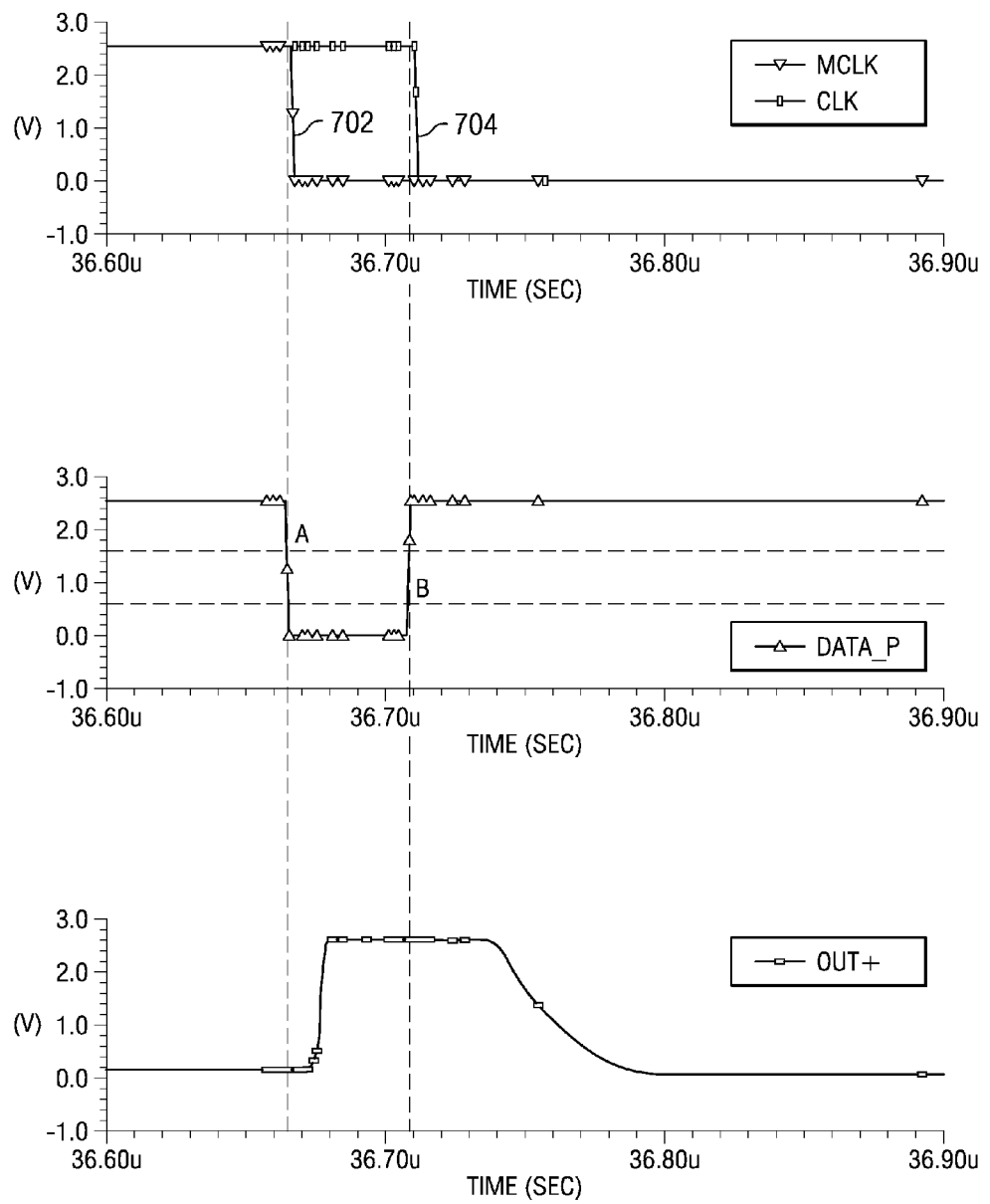
FIG. 7 is a plot of example circuit waveforms for the deglitch logic/clock generator of FIG. 2.

FIG. 7 is a diagram of example circuit waveform results for the logic circuit 200 of FIG. 3. The example circuit waveform results include a waveform having an MCLK signal trace 602 and a CLK_P signal trace 604 overlaid on the top plot of FIG. 7. The waveform results also include a plot of the DATA_P signal and the OUT+ signal of the differential signaling driver 101 from FIG. 1.

As mentioned above, the deglitch logic/clock generator 110 delays the clock signal CLK_P for low duty cycles (e.g., approximately 1%-50%) to facilitate proper transfer of charge from CP to the high side n-channel MOSFET 150 before the high side boosted gate drive circuit 130 begins recharging CP. For high duty cycles (i.e., greater than 50%), the master clock signal MCLK is passed through as the CLK_P signal for use by the high side boosted gate drive circuit 130. For low duty cycles, the deglitch logic/clock generator 110 generates a CLK_P signal different than the MCLK signal.

As described in connection with the example deglitch logic/clock generator 110 described in FIG. 1, the CLK_P signal is high while the MCLK signal is high. For low DATA_P duty cycles such as the example shown in FIG. 7, the CLK_P signal stays at logic high when MCLK goes to logic low and DATA_P is at logic low. When DATA_P goes to logic high, CLK_P drops to logic low to match MCLK.

Figure 8:
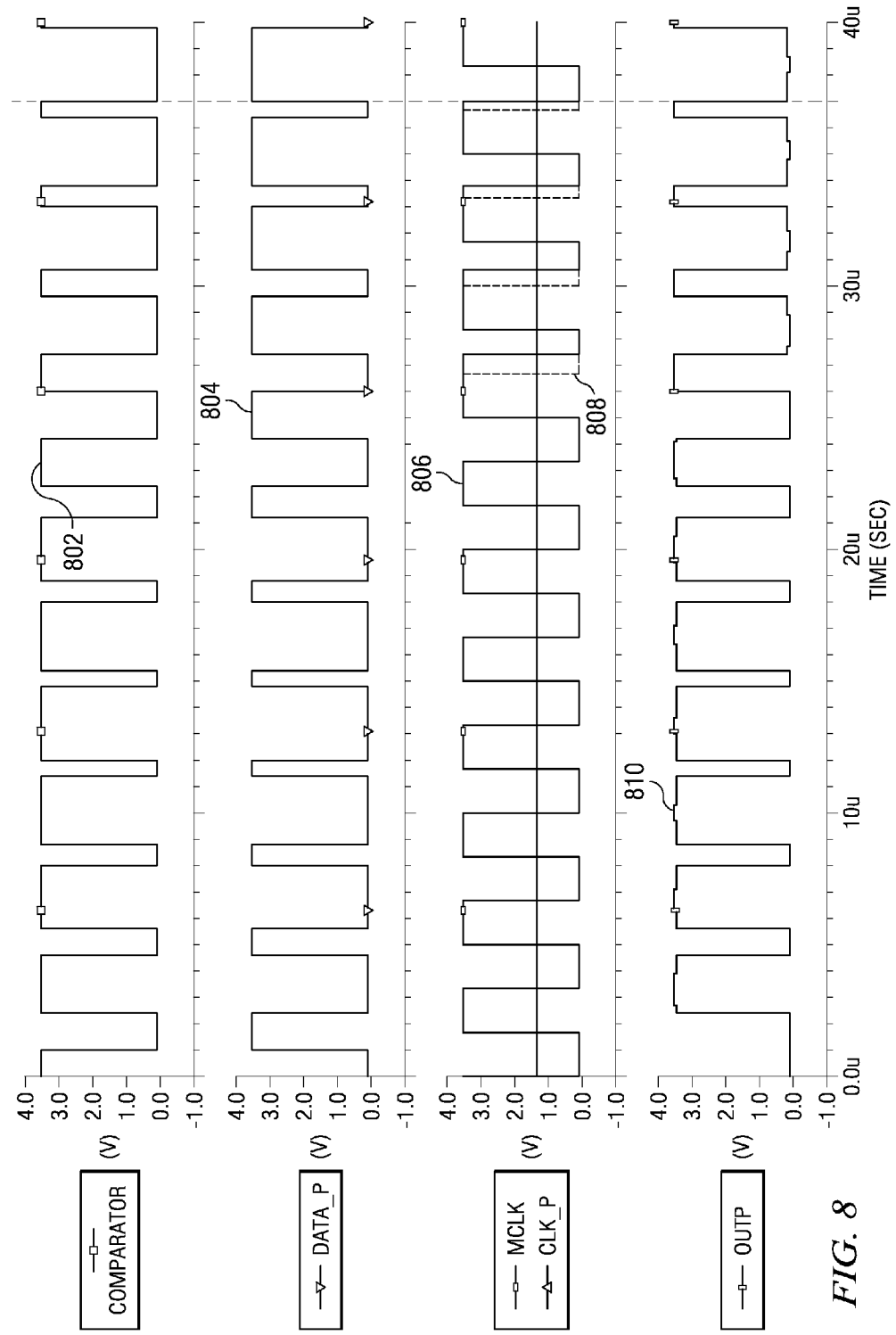
FIG. 8 is a plot of example circuit waveforms for input and output signals for a variety of input duty cycles.

FIG. 8 is a plot of example circuit waveforms for a variety of input duty cycles. The DATA_P waveform 804 illustrates several duty cycles of the DATA_P signal, which is the logical inverse of the comparator output. The deglitch logic/clock generator 110 and the high side boosted gate drive circuit 130 utilize the DATA_N signal to generate the output waveform 710 (OUT+) as described above. The CLK_P waveform 806 and the MCLK waveform 808, in combination with the DATA_P waveform, illustrate the clock delay function of the timing signal for DATA_P duty cycles less than 50%. The MCLK signal has a falling edge approximately 50% between the rising edge and falling edge of the OUT signal. However, for DATA_P duty cycles less than 50%, the falling edge of CLK_P is delayed until after the rising edge of DATA_P.

Figure 9:
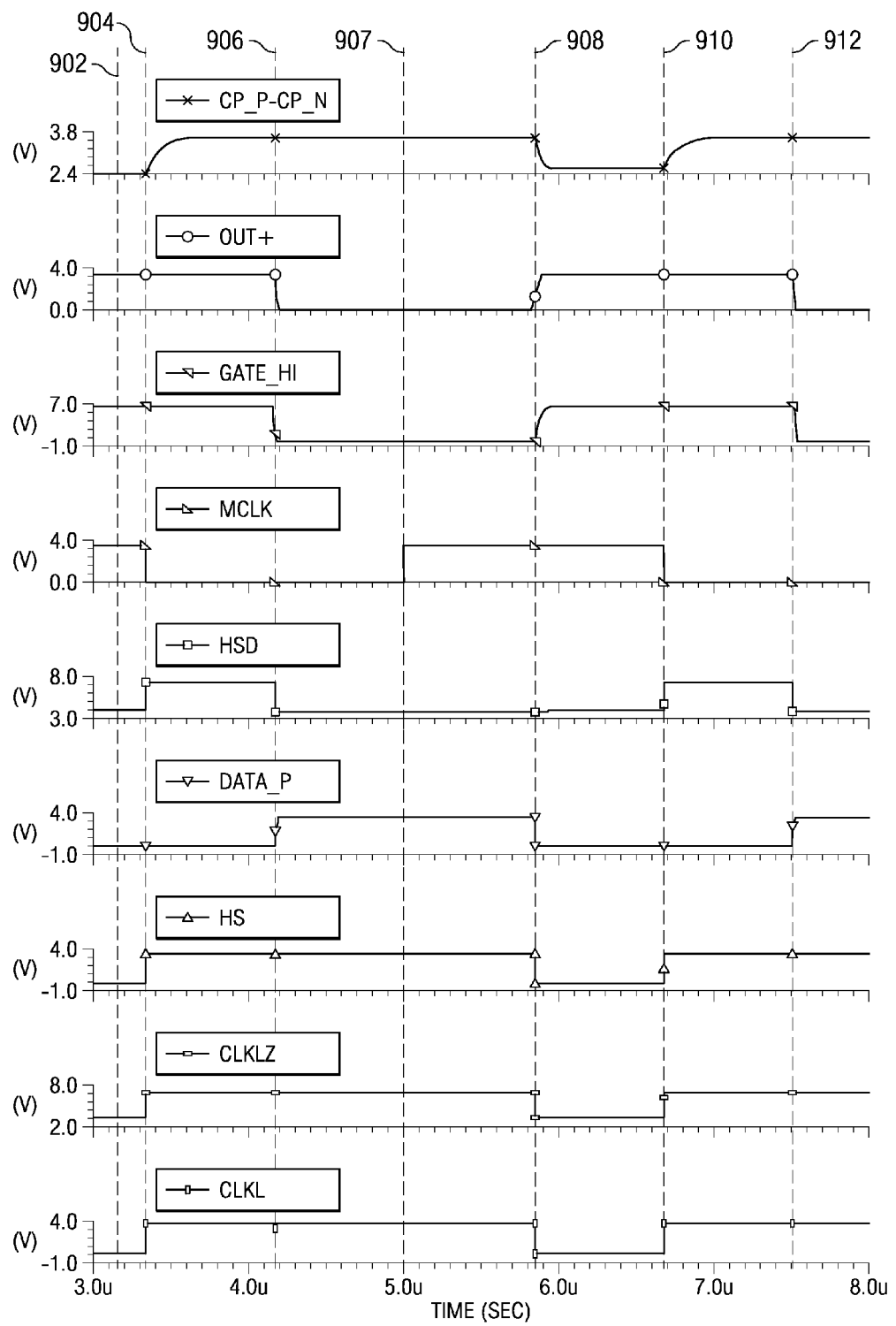
FIG. 9 is a diagram of example circuit waveform results of the example circuits of FIGS. 4-6, with the input having a 50% duty cycle.

FIG. 9 is a diagram of example circuit waveform results of the example circuits 110-130 of FIGS. 4-6, with the input DATA_P having a 50% duty cycle. As described herein, at a 50% input duty cycle the deglitch logic/clock generator 110 outputs a CLK_P signal that tracks the MCLK signal.

The example waveform results will be used to describe the normal operation of the example high side boosted gate drive circuit 130 of FIG. 6. The first waveform (from top to bottom) shows the voltage across the terminals of CP (i.e., the voltage at CP_P less the voltage at CP_N). The next waveform shows the voltage at OUT+, followed by the voltage at GATE_HI, the master clock signal (MCLK), HSD, DATA, HS, CLKLZ and CLKL, in order from top to bottom. At a particular moment 902, DATA_N is low, CLK_P is high, and CLKL and CLKLZ are low. While DATA_P is still low, MCLK falls from high to low at 904, which causes CLKL and CLKLZ to go high, via the circuit 400 of FIG. 5, and turn on MN10 and MN9, respectively. As a result, CP_P is coupled to PVDD, CP_N is coupled to PGND, and CP is charged by the voltage difference across its terminals. The rate of charging and discharging of CP is determined by the capacitance value of CP and the drain-source resistances of MN9 and MN10.

After a time determined by the duty cycle of DATA, DATA_N goes high at 906, causing GATE_HI to go low. GATE_HI turns off the high side n-channel MOSFET 150, while GATE_LO turns on the low side n-channel MOSFET 160, coupling OUT+ to PGND and causing OUT+ to go low. HSD also goes low via the example circuit 110 of FIG. 4, which does not turn on MP6 due to the backgate configuration provided by MP14 and MP15. However, MN9 remains on, so CP_P remains coupled to PVDD and CP does not discharge. During the time that DATA_N is high, MCLK also goes high at point 907.

When DATA_P next goes low at 908, HS, CLKL, and CLKLZ also go low. As a result, MN9, MN10, and MN11 are turned off while MP12 and MP13 are turned on. Although the HSD signal does not change, MP13 is turned on due to the backgate connection changing voltages via MP14 and MP15. By coupling CP_N to PVDD, the voltage at CP_N jumps to PVDD or substantially to PVDD, and the charge on CP causes CP_P to jump to 2*PVDD. GATE_HI is charged by CP via MP13 and causes the high side n-channel MOSFET 150 to turn on, while the low side n-channel MOSFET 160 is turned off by GATE_LO. Thus, OUT+ goes high. Providing charge to GATE_HI causes CP to discharge energy. GATE_HI is proportional to the capacitances of CP and the high side n-channel MOSFET 150 as shown in Equation 2:

$$V_{GATE\_HI} \propto C_P/C_P + C_{GS} + C_{GD} \quad (Eq. 2)$$

where $C_{GS}$ is the gate-source capacitance of the n-channel MOSFET 150, and $C_{GD}$ is the gate-drain capacitance of the n-channel MOSFET 150. The above-described process iterates (e.g., 904 repeats at 910, 906 repeats at 912) to drive the MOSFET 150 and, thus, OUT+ with a duty cycle equal to or substantially equal to DATA, as shown in FIGS. 9-11 by comparing the duty cycles of the OUT+ and DATA_P waveforms.

As mentioned above, the high side boosted gate drive circuit 130 guarantees that CP is charging or maintaining charge for at least 50% of the clock cycle. Thus, the time between points 904 and 908 must be greater than or equal to half of the clock cycle, and the time between points 908 and 910 must be less than or equal to half of the clock cycle. As described above, during each cycle CP begins charging when the MCLK signal goes from high to low at point 904. Due to the 50% duty cycle of the MCLK signal, if CP charges or maintains the charge beyond the point 907 where MCLK goes high, a charging rate greater than half of the clock cycle will be achieved. In the example high side boosted gate drive circuit 130, MCLK has a rising edge at point 907, which is halfway between the rising and falling edges of the DATA_N signal. CP begins discharging each cycle at point 908, which is the falling edge of DATA_P and is always after point 907. As a result, CP has a charging cycle greater than half of the clock cycle.

Figure 10:
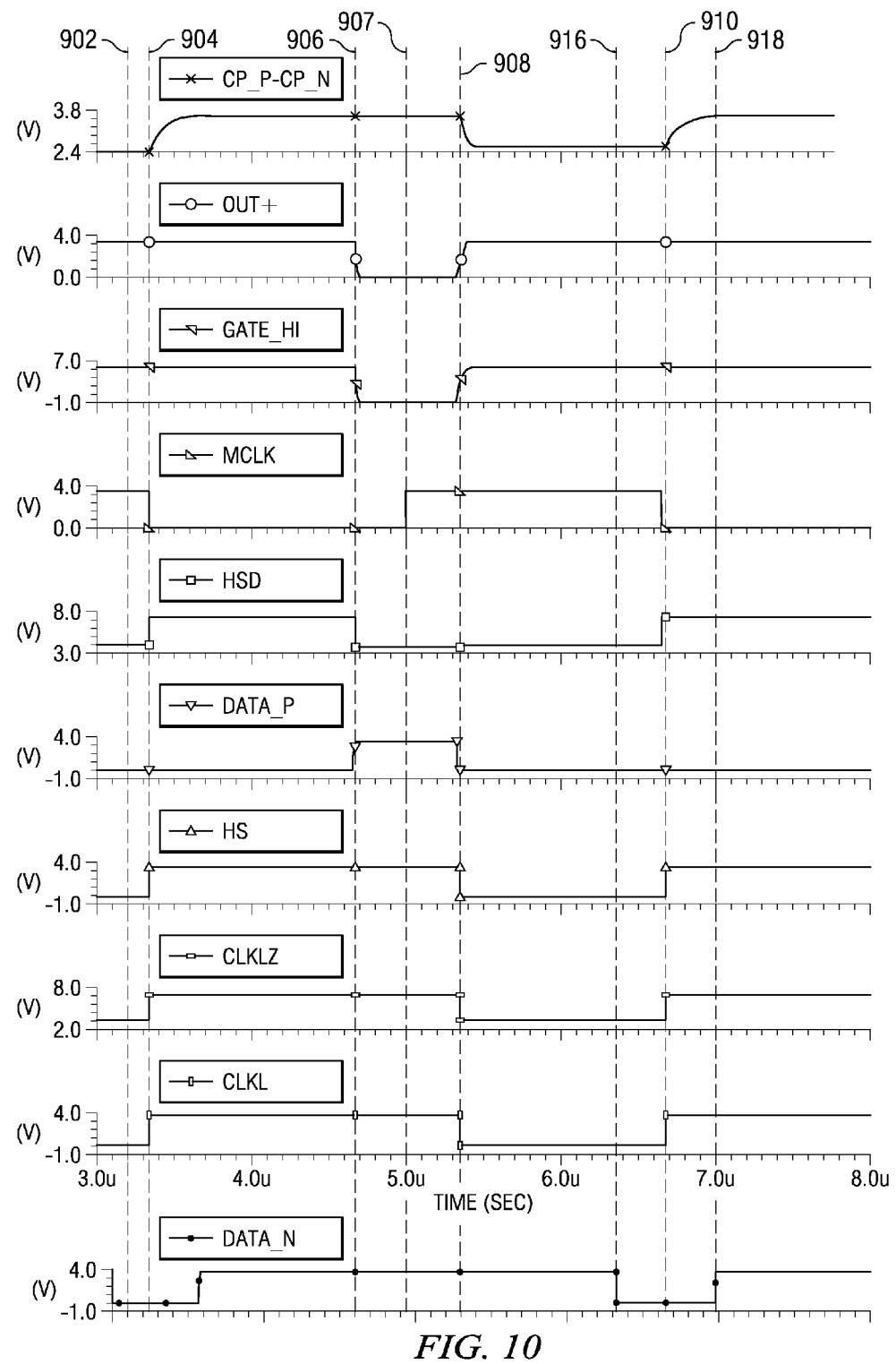
FIG. 10 is a diagram of example circuit waveform results of the example circuits of FIGS. 4-6, with the input having an 80% duty cycle.

FIG. 10 is a diagram of example circuit waveform results of the example circuits 110-130 of FIGS. 4-6, with the input DATA_P having an 80% duty cycle. The waveform results of FIG. 10 may correspond to the logic sequence described in FIGS. 3B-3G. Specifically, the point 908 represents the transition from FIG. 3B to FIG. 3C, the point 916 may represent the transition from FIG. 3C to FIG. 3D, the point 910 represents the transition from FIG. 3D to FIG. 3E, and the point 918 may represent the transition from FIG. 3E to FIG. 3F.

Figure 11:
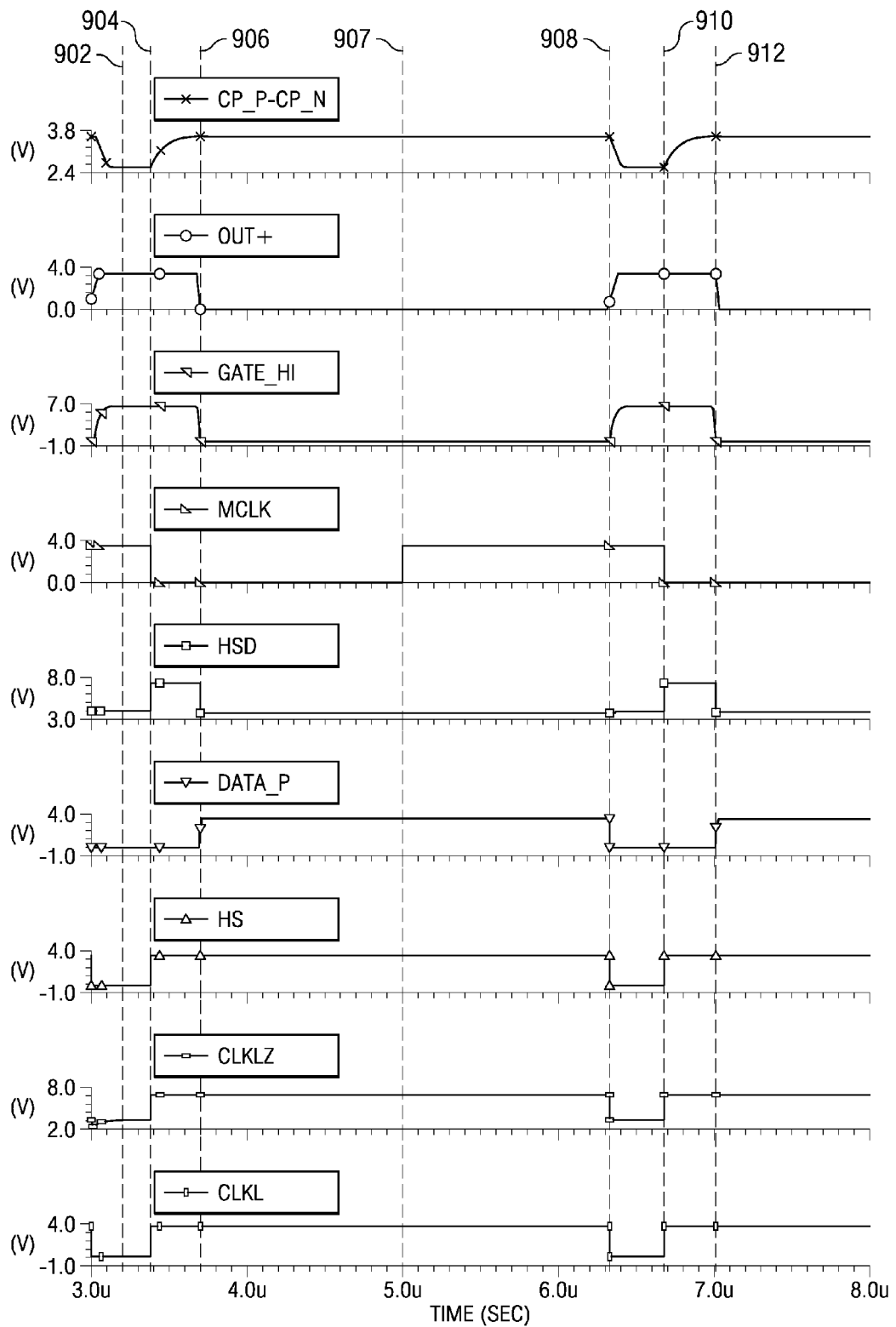
FIG. 11 is a diagram of example circuit waveform results of the example circuits of FIGS. 4-6, with the input having a 20% duty cycle.

FIG. 11 is a diagram of example circuit waveform results the example circuits 110-130 of FIGS. 4-6, with the input having a 20% duty cycle. As described above, the deglitch logic/clock generator 110 generates a CLK_P signal for use by the timing signal generator 120 of FIG. 1 that is delayed from the MCLK signal. The delayed CLK_P signal allows the capacitor CP enough time to discharge before beginning to charge again for the next clock cycle.

The above-described process may be used with the example DATA_P duty cycles shown in FIGS. 9-11 to achieve the OUT+ duty cycles shown in the same, respectively. For example, the events at points 902-912 shown in FIGS. 10 and 11 correspond to the events with like reference numbers in FIG. 9. Although the circuit waveform results of FIGS. 9-11 are shown with 50%, 80%, and 20% duty cycles, respectively, it should be recognized that the DATA_P and OUT+ signals of the example differential signaling driver 101 may have any duty cycle(s) from 100% to approximately 1% as described herein.

Although certain methods and apparatus have been described herein, other implementations are possible. The scope of coverage of this patent is not limited to the specific examples described herein. On the contrary, this patent covers all methods and apparatus fairly falling within the scope of the invention.

What is claimed is:

1. An apparatus comprising:
   a switching device configured to selectively conduct current in response to a charge being present at a control terminal for a duty cycle;
   a charging device configured to deliver charge to the control terminal based on a first duty cycle;
   a charge control device configured to selectively couple the charging device to deliver charge to the control terminal and to selectively decouple the charging device from the control terminal to charge the charging device, wherein the charge control device includes a field-effect transistor (FET) and blocking diodes, configured to selectively couple the charging device to the control terminal based on a gate voltage and a backgate voltage; and
   a discharge control device configured to remove charge from the control terminal.

2. The apparatus driver as defined in claim 1, wherein the charging device is configured to be charged while decoupled from the control terminal.

3. The apparatus driver as defined in claim 2, wherein the charging device is configured to be charged for a second duty cycle different from the first duty cycle.

4. The apparatus driver as defined in claim 3, wherein the second duty cycle is greater than or equal to 50%.

5. The apparatus driver as defined in claim 1, wherein the apparatus further comprises a timing circuit to cause the charge control device to couple the charging device to the switching device based on the first duty cycle.

6. The apparatus driver as defined in claim 1, wherein the apparatus further comprises a charge pump configured to provide charge to the charging device when the charging device is decoupled from the control terminal.

7. The apparatus driver as defined in claim 1, wherein the switching device is a high-side output n-channel field-effect transistor.

8. The apparatus driver as defined in claim 1, wherein the apparatus further comprises a clock delay circuit configured to delay the charge control device from decoupling the charging device from the control terminal.

9. The apparatus driver as defined in claim 8, wherein the clock delay circuit delays the charge control device in response to an input duty cycle less than a predetermined duty cycle.

10. A circuit comprising:
    a switching device having an n-channel FET, configured to selectively conduct current in response to a charge being present at a gate terminal for an input duty cycle;
    a charging device having a bootstrap capacitor, configured to deliver charge to the gate terminal and to be charged for a second duty cycle different from the input duty cycle;
    a charge control device having a p-channel FET and blocking diodes, configured to selectively couple the charging device to deliver charge to the gate terminal, to selectively decouple the charging device from the gate terminal to charge the charging device, and to maintain charge on the gate terminal in response to decoupling the charging device from the gate terminal;
    a discharge control device having an n-channel FET, configured to selectively remove charge from the gate terminal and to selectively maintain charge on the gate terminal based on the input duty cycle;
    a charge pump having a first and a second n-channel FET configured to selectively charge the charging device, and a p-channel FET configured to increase a voltage of the charging device; and
    a timing device configured to generate the second duty cycle based on the input duty cycle.

11. An apparatus comprising:
    a high side FET;
    a low side FET that is coupled to the source of the high side FET at its drain; and
    a driver for the high side FET having:
       a first FET that receives a first drive signal at its gate;
       a second FET that is coupled to the drain of the first MOS transistor at its drain and that receives a clock signal at its gate;
       a third FET that receives an inverse of the clock signal at its gate;
       a capacitor that is coupled between the drain of the first MOS transistor and that source of the third FET transistor;
       a fourth FET that is coupled to the source of the third FET at its source, that is coupled to the gate of the high side FET at its drain, and that receives a second drive signal at its gate; and
       a fifth FET that is coupled to the drain of the fourth FET at its drain and that receives a data signal at its gate.

12. The apparatus as defined in claim 11, wherein the driver further comprises a blocking diode coupled between the drain and source of the fourth FET.

13. The apparatus as defined in claim 11, wherein the apparatus further comprises an OR gate that receives the clocks signal, that is coupled to the gate of the low side FET, and that is coupled to the gate of the first FET, and wherein the OR gate provide the first drive signal to the first FET.

14. The apparatus as defined in claim 11, wherein the apparatus further comprises:
    a clock generator that receives a master clock signal and a differential data signal; and
    a timing signal generator that is coupled to the clock generator and the driver for the high side FET.

15. The apparatus as defined in claim 14, wherein the timing signal generator further comprises
    a NAND gate that is coupled to the gate of the high side FET and the clock generator;
    an OR gate is coupled to the NAND gate;
    an inverter coupled to the OR gate; and
    a capacitor coupled to the inverter and the gate of the fourth FET, wherein the capacitor provides the second drive signal to the fourth FET.

16. The apparatus as defined in claim 14, wherein clock generator further comprises:
    a first logic circuit that each receive a first portion of the differential data signal;
    a second logic circuit that each receive a second portion of the differential data signal;
    a first inverter that receives the first portion of the differential data signal and that is coupled to the second logic circuit;
    a second inverter that receives the first portion of the differential data signal and that is coupled to the first logic circuit;

a first OR gate that is coupled to the first inverter and that receives the master clock signal;

a second OR gate that is coupled to the second inverter and that receives the master clock signal;

a first multiplexer having a first input terminal, a second input terminal, and a selection terminal, wherein the first input terminal of the first multiplexer receives the master clock signal, and wherein the second input terminal of the first multiplexer is coupled to the first OR gate, and wherein the selection terminal of the first multiplexer is coupled to the first logic circuit; and a second multiplexer having a first input terminal, a second input terminal, and a selection terminal, wherein the first input terminal of the second multiplexer receives the master clock signal, and wherein the second input terminal of the second multiplexer is coupled to the second OR gate, and wherein the selection terminal of the second multiplexer is coupled to the second logic circuit.

* * * * *